US012791581B2

(12) United States Patent
Whittington

(10) Patent No.: US 12,791,581 B2
(45) Date of Patent: Nov. 10, 2026

(54) PROBE INTEGRATED CIRCUIT AND MEASUREMENT SYSTEM

(71) Applicant: NATIONAL INSTRUMENTS CORPORATION, Austin, TX (US)

(72) Inventor: Mark Whittington, Austin, TX (US)

(73) Assignee: NATIONAL INSTRUMENTS CORPORATION, Austin, TX (US)

( * ) Notice: Subject to any disclaimer, the term of this patent is extended or adjusted under 35 U.S.C. 154(b) by 145 days.

(21) Appl. No.: 18/911,546

(22) Filed: Oct. 10, 2024

(65) Prior Publication Data

US 2025/0123306 A1 Apr. 17, 2025

Related U.S. Application Data

(60) Provisional application No. 63/590,892, filed on Oct. 17, 2023, provisional application No. 63/589,503, filed on Oct. 11, 2023.

(51) Int. Cl.
*G01R 1/067* (2006.01)
*G01R 1/04* (2006.01)

(52) U.S. Cl.
CPC ....... *G01R 1/06766* (2013.01); *G01R 1/0408* (2013.01)

(58) Field of Classification Search
CPC ............................ G01R 1/0408; G01R 1/0676
See application file for complete search history.

(56) References Cited

U.S. PATENT DOCUMENTS 7,388,389 B2 6/2008 Boll et al.
7,486,095 B2 2/2009 Long
9,110,098 B2 8/2015 Mikuni et al.
2008/0106277 A1 5/2008 Pillai et al.

FOREIGN PATENT DOCUMENTS

CN 108333393 A * 7/2018 ............. G01R 35/02
WO 2021133558 A1 7/2021

* cited by examiner

*Primary Examiner* — Minh Q Phan
(74) *Attorney, Agent, or Firm* — Kowert, Hood, Munyon, Rankin & Goetzel, P.C.; Jeffrey C. Hood; Luke Langsjoen

(57) ABSTRACT

Disadvantages associated with present day instrument probes, e.g., active probes used with oscilloscopes, may be overcome by implementing an active probe entirely as a packaged integrated circuit (IC). The probe IC may be implemented in a small, low pin-count package to facilitate the mounting of many probe ICs in a small area. The probe IC may include an interface for configuration as well as customized software to control the probe IC and measurement instrumentation, for example, an oscilloscope, for a variety of applications. The probe IC may be implemented as any one of different types of probes, including active probes and passive probes, voltage probes and current probes, or single ended probes and differential probes.

20 Claims, 6 Drawing Sheets

PROBE INTEGRATED CIRCUIT AND MEASUREMENT SYSTEM

PRIORITY INFORMATION

This application claims priority to U.S. Provisional Patent Application No. 63/589,503, titled "Probe Integrated Circuit and Measurement System" and filed on Oct. 11, 2023, and U.S. Provisional Patent Application No. 63/590,892, titled "Probe Integrated Circuit and Measurement System" and filed on Oct. 17, 2023, which are both hereby incorporated by reference in their entirety, as though fully and completely set forth herein.

BACKGROUND OF THE INVENTION

Field of the Invention

This invention relates generally to measurement and data acquisition systems including integrated circuit probes and measurement systems.

Description of the Related Art

Measurement systems are oftentimes used to perform a variety of functions, including measurement of physical phenomena, measurement of certain characteristics or operating parameters of a unit under test (UUT) or device under test (DUT), testing and analysis of physical phenomena, process monitoring and control, control of mechanical or electrical machinery, data logging, laboratory research, and analytical chemistry, to name a few examples.

A typical contemporary measurement system comprises a computer system, which commonly features a measurement device, or measurement hardware. The measurement device may be a computer-based instrument, a data acquisition device or board, a programmable logic device (PLD), an actuator, or other type of device for acquiring or generating data. The measurement device may be a card or board plugged into one of the I/O slots of the computer system, or a card or board plugged into a chassis, or an external device. For example, in a common measurement system configuration, the measurement hardware is coupled to the computer system through a PCI bus, PXI (PCI extensions for Instrumentation) bus, a USB (Universal Serial Bus), a GPIB (General-Purpose Interface Bus), a VXI (VME extensions for Instrumentation) bus, a serial port, parallel port, or Ethernet port of the computer system. Optionally, the measurement system includes signal-conditioning devices, which receive field signals and condition the signals to be acquired.

A measurement system may typically include transducers, sensors, or other detecting means for providing "field" electrical signals representing a process, physical phenomena, equipment being monitored or measured, etc. The field signals are provided to the measurement hardware. In addition, a measurement system may also typically include actuators for generating output signals for stimulating a DUT or for influencing the system being controlled. These measurement systems, which can be generally referred to as data acquisition systems (DAQs), are primarily used for converting a physical phenomenon (such as temperature or pressure) into an electrical signal and measuring the signal in order to extract information. PC-based measurement and DAQs and plug-in boards are used in a wide range of applications in the laboratory, in the field, and on the manufacturing plant floor, among others.

Multifunction DAQ devices typically include digital I/O capabilities in addition to the analog capabilities described above. Digital I/O applications may include monitoring and control applications, video testing, chip verification, and pattern recognition, among others. DAQ devices may include one or more general-purpose, bidirectional digital I/O lines to transmit and receive digital signals to implement one or more digital I/O applications. DAQ devices may also include Source-Measure Units (SMUs), which may apply a voltage to a DUT and measure the resulting current, or may apply a current to the DUT and measure the resulting voltage. Measurement systems, e.g. DAQ devices as noted above, may also include oscilloscopes and/or other types of signal analyzers, signal generators, function analyzers, etc.

Typically, in a measurement or data acquisition process, analog signals are received by a digitizer, which may reside in a DAQ device or instrumentation device. The analog signals may be received from a sensor, converted to digital data (possibly after being conditioned) by an Analog-to-Digital Converter (ADC), and transmitted to a computer system for storage and/or analysis. Then, the computer system may generate digital signals that are provided to one or more digital to analog converters (DACs) in the DAQ device. The DACs may convert the digital signal to an output analog signal that is used, e.g., to stimulate a DUT or to influence the system being controlled.

Oscilloscopes are one type of widely used measurement instruments. Oscilloscopes may be used with what are referred to as "active probes," which receive power and transmit signal to the host oscilloscope through the interconnecting cable. Existing active probes are intended to be hand-held. The mounting of a (normally) hand-held probe is awkward in an integrated circuit (IC) test fixture, which is typically a printed circuit board assembly. As the probe must be located very close to the signal node being probed to minimize any loading effects, space constraints might limit the maximum number of mountable probes.

Other corresponding issues related to the prior art will become apparent to one skilled in the art after comparing such prior art with the present invention as described herein.

SUMMARY OF THE INVENTION

In various embodiments, disadvantages associated with present day active probes, e.g., active probes used with oscilloscopes, may be overcome by implementing an active probe entirely as a packaged integrated circuit. A small, low pin count package may be selected to facilitate the mounting of many probe ICs in a small area. The probe IC may include an interface for configuration as well as customized software that controls the IC and measurement instrumentation, for example, an oscilloscope, for the selected application. Various embodiments of a probe IC proposed herein may encompass different types of probes, including active probes and passive probes, voltage probes and current probes, or single ended probes and differential probes.

This Summary is intended to provide a brief overview of some of the subject matter described in this document. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The foregoing, as well as other objects, features, and advantages of this invention may be more completely understood by reference to the following detailed description when read together with the accompanying drawings in which.

Figure 1:
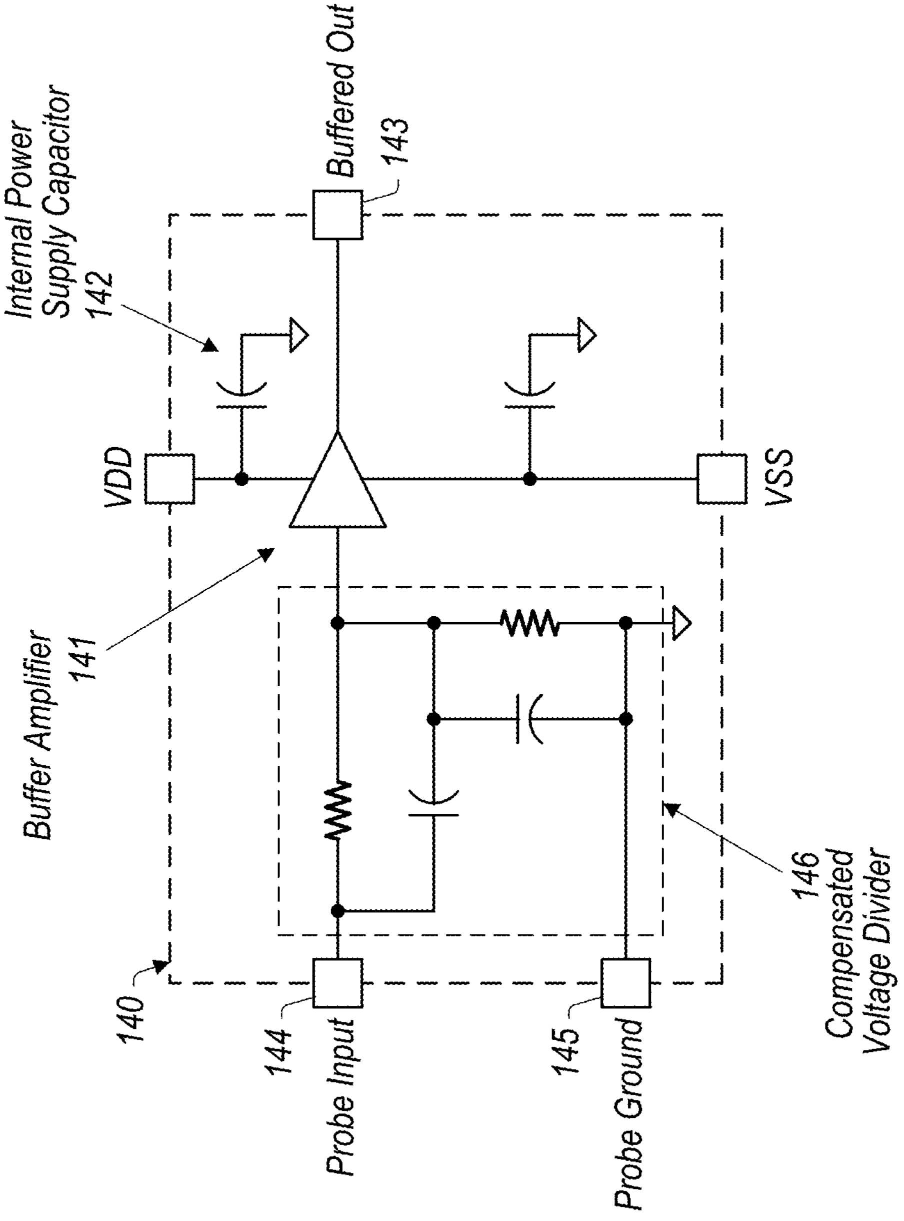
FIG. 1 shows a simplified diagram of an example probe IC with power supplied from a test fixture, according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "coupled" means "directly or indirectly connected".

DETAILED DESCRIPTION OF THE EMBODIMENTS

Embodiments of the present invention may be used in systems configured to perform test and/or measurement functions, to control and/or model instrumentation or industrial automation hardware, or to model and simulate functions, e.g., modeling or simulating a device or product being developed or tested, etc. However, it is noted that the present invention may equally be used for a variety of applications, and is not limited to the applications enumerated above. In other words, applications discussed in the present description are exemplary only, and the present invention may be used in any of various types of systems. Thus, the system and method of the present invention may be used in any of various types of applications where measurement probes are used with instruments, e.g., measurement instruments such as oscilloscopes.

While various embodiments are described herein in greater detail with respect to an oscilloscope, the connectivity/connection technology described herein may equally be used with, and/or applied to many other test instruments, such as a function generator or digital test equipment (i.e., semiconductor test equipment). In various embodiments, a novel probe IC may be coupled to an instrument for performing measurements or acquiring/delivering data/information from/to the instrument and/or or otherwise facilitate interacting with the instrument.

FIG. 1 shows a simplified circuit diagram of an example probe IC 140, according to some embodiments. As shown in FIG. 1, a compensated voltage divider 146 is placed in front of a buffer amplifier 141. The buffer amplifier 141 receives power via a dedicated power port (VDD), for example from a test fixture, and drives a controlled impedance line (e.g., a 50 Ohm impedance line) at the buffered output 143, for example to the receiving test equipment such as an oscilloscope. The circuit implementation shown in FIG. 1 may be constructed from discrete components at a board level. However, example probe circuit shown in FIG. 1 is a probe IC whereby the entire circuit is implemented as a single packaged IC. Various embodiments of probe IC 140 may feature/include the design of a compensated voltage divider that is both factory trimmable and able to withstand large overvoltage events without damage. Similarly, to facilitate high mounting density, the power supply decoupling capacitors 142 may be implemented entirely on the probe IC rather than being external to the probe IC. The buffer amplifier 141 may be designed to have a good pulse response given the reduced total power supply decoupling capacitance. In various embodiments, on-chip power supply decoupling capacitance 142 may be limited to a few hundred picofarads (pF), which is lower than the typical 100,000 picofarads (pF) value of external decoupling capacitors.

Figure 2:
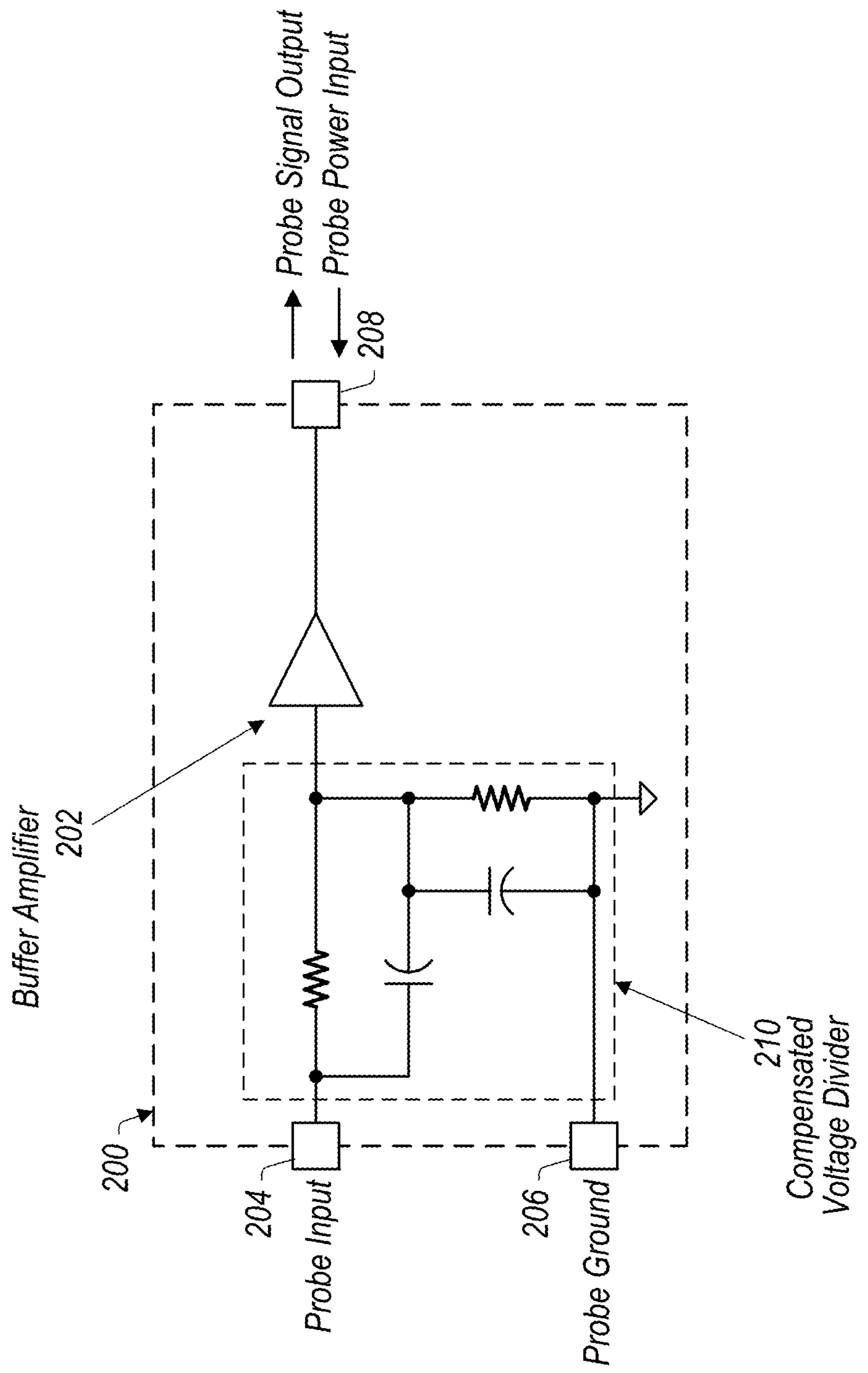
FIG. 2 shows a simplified diagram of an example probe IC with power supplied from a test equipment via the probe signal output port, according to some embodiments.

FIG. 2 shows a simplified circuit diagram of an example probe IC 200, according to some embodiments. As shown in FIG. 2, a compensated voltage divider 210 is placed in front of a buffer amplifier 202. The buffer amplifier 202 receives power via port 208, which is a hybrid port configured as a probe signal output and probe power input. Therefore, power may be received by probe IC 200 from the test equipment via the port 208 also used to provide test signals to the test equipment. Similar to probe IC 140, the circuit implementation shown in FIG. 2 is a probe IC whereby the entire circuit is implemented as a single packaged IC. Further similar to probe IC 140, various embodiments of probe IC 200 may feature/include the design of a compensated voltage divider 210 that is both factory trimmable and able to withstand large overvoltage events without damage.

Figure 3:
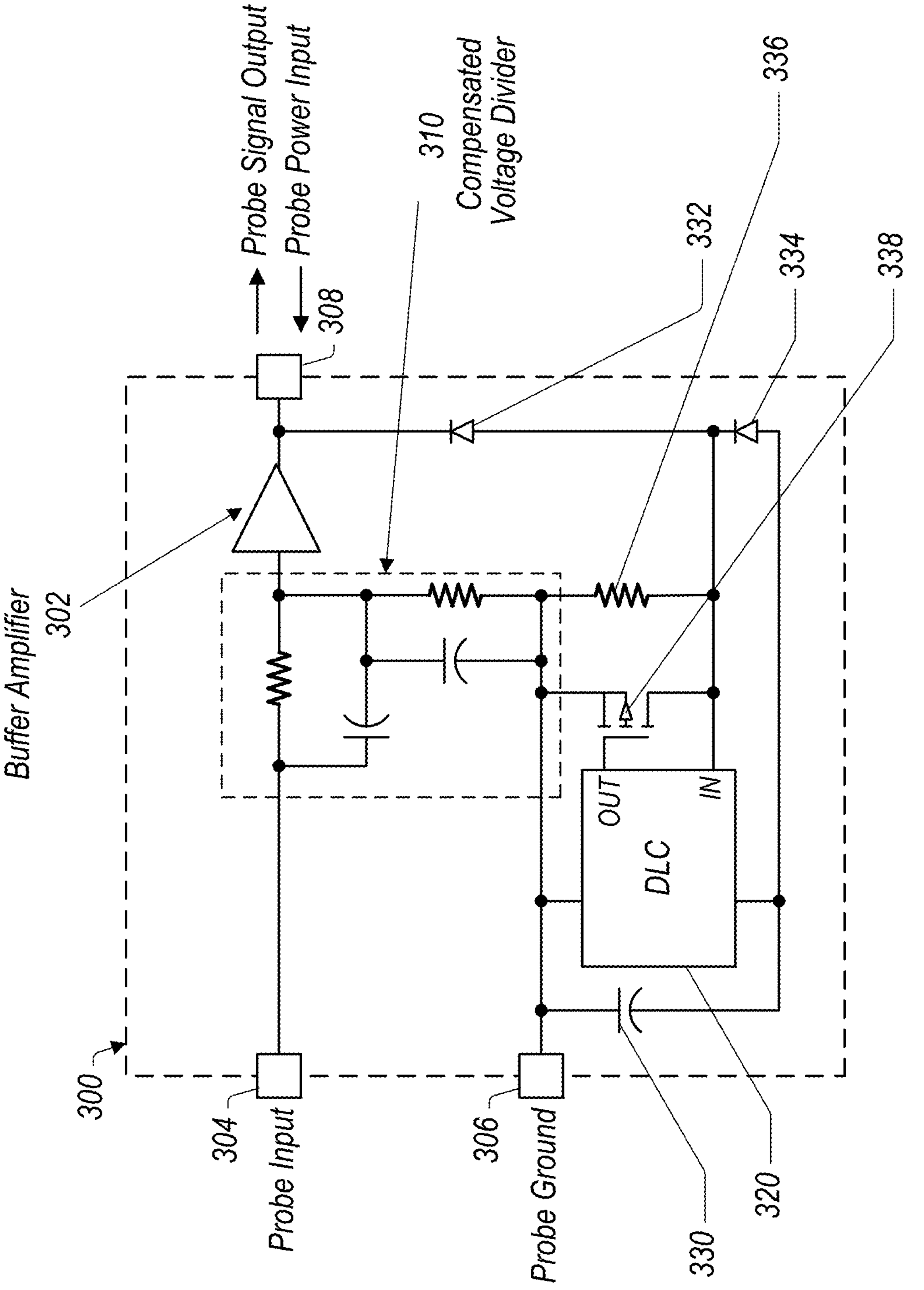
FIG. 3 shows a simplified diagram of an example probe IC that incorporates digital signal processing logic/circuitry, according to some embodiments.

FIG. 3 shows a simplified circuit diagram of an example probe IC 300, according to some embodiments. As shown in FIG. 3, buffer amplifier 302 receives power via port 308, which is a hybrid port configured as a probe signal output and probe power input, similar to port 208 of probe IC 200. Furthermore, probe IC 300 includes means for bidirectional communication via digital logic circuitry (DLC) 320, which may include digital processing circuitry and memory (e.g., non-volatile memory). The voltage level at port 308 may be brought below zero by a coupled host measuring device, based at least in part on control elements 330-338 coupled to DLC 320, thereby allowing communication with the host measuring device with the aid of DLC 320. Probe IC 300 may provide a stimulus signal through the same signal path to a device under test (DUT), query the DUT to obtain device type, may store calibration parameters, and may enable on-board trimming of the probe IC.

Probe IC 140, probe IC 200, and probe IC 300 may all include configurability by the oscilloscope, measurement instrumentation or system software.

Figure 4:
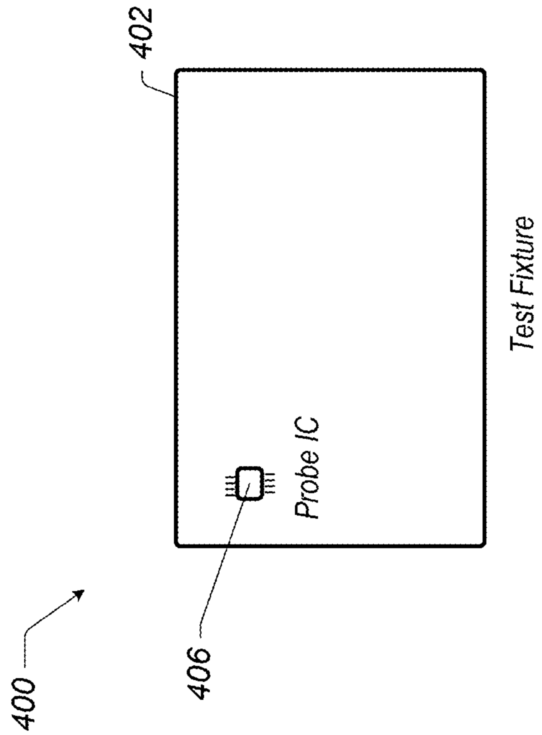
FIG. 4 shows a simplified diagram of a probe IC disposed on a test fixture, according to some embodiments.

FIG. 4 shows an example system 400 in which a probe IC 406 is mounted on a test fixture 402. In some embodiments, test fixture 401 is a printed circuit board assembly. As shown in FIG. 4, probe IC 406 is housed in a small, low pin-count package which may be mounted on a very small area of test fixture 402 relative to the entire area of test fixture 402. Probe IC 406 may include an interface for configuration as well as customized software to control probe IC 406 and the measurement instrumentation (for example, an oscilloscope) for various applications. Test fixture 402 may be part of a measurement system or may couple to a measurement instrument, which is not explicitly shown in FIG. 4. Furthermore, multiple probe ICs 406 may be mounted on test fixture 402 as desired, due to the small size and form factor of probe IC 406.

Figure 5:
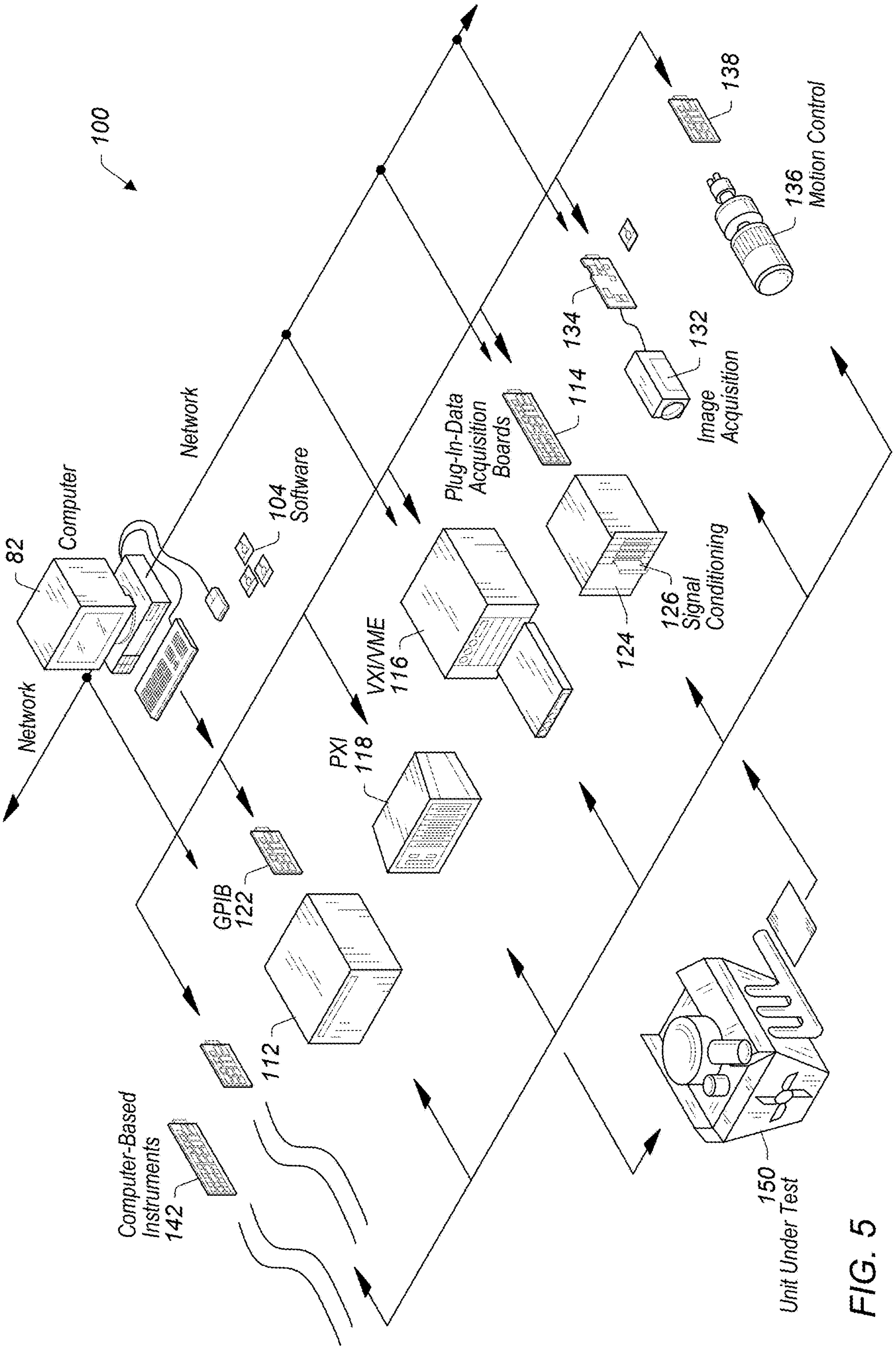
FIG. 5 shows an example instrumentation control system with instruments networked together according to one set of embodiments.

FIG. 5 illustrates an exemplary instrumentation control system 100 which may be configured according to embodiments of the present invention. System 100 comprises a host computer 82 which may couple to one or more instruments configured to perform a variety of functions using one or more probe ICs as disclosed herein. Host computer 82 may comprise a CPU, a display screen, memory, and one or more input devices such as a mouse or keyboard as shown. Computer 82 may operate with one or more instruments to analyze, measure, or control a unit under test (UUT) or process 150. The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices. The computer system may couple to and operate with one or more of these instruments. In some embodiments, the computer system may be coupled to one or more of these instruments via a network connection, such as an Ethernet connection, for example, which may facilitate running a high-level synchronization protocol between the computer system and the coupled instruments. The instruments may be coupled to the unit under test (UUT) or process 150, or may be coupled to receive field signals, typically generated by transducers. System 100 may be used in a data acquisition and control applications, in a test and measurement application, an image processing or machine vision application, a process control application, a man-machine interface application, a simulation application, or a hardware-in-the-loop validation application, among others.

Figure 6:
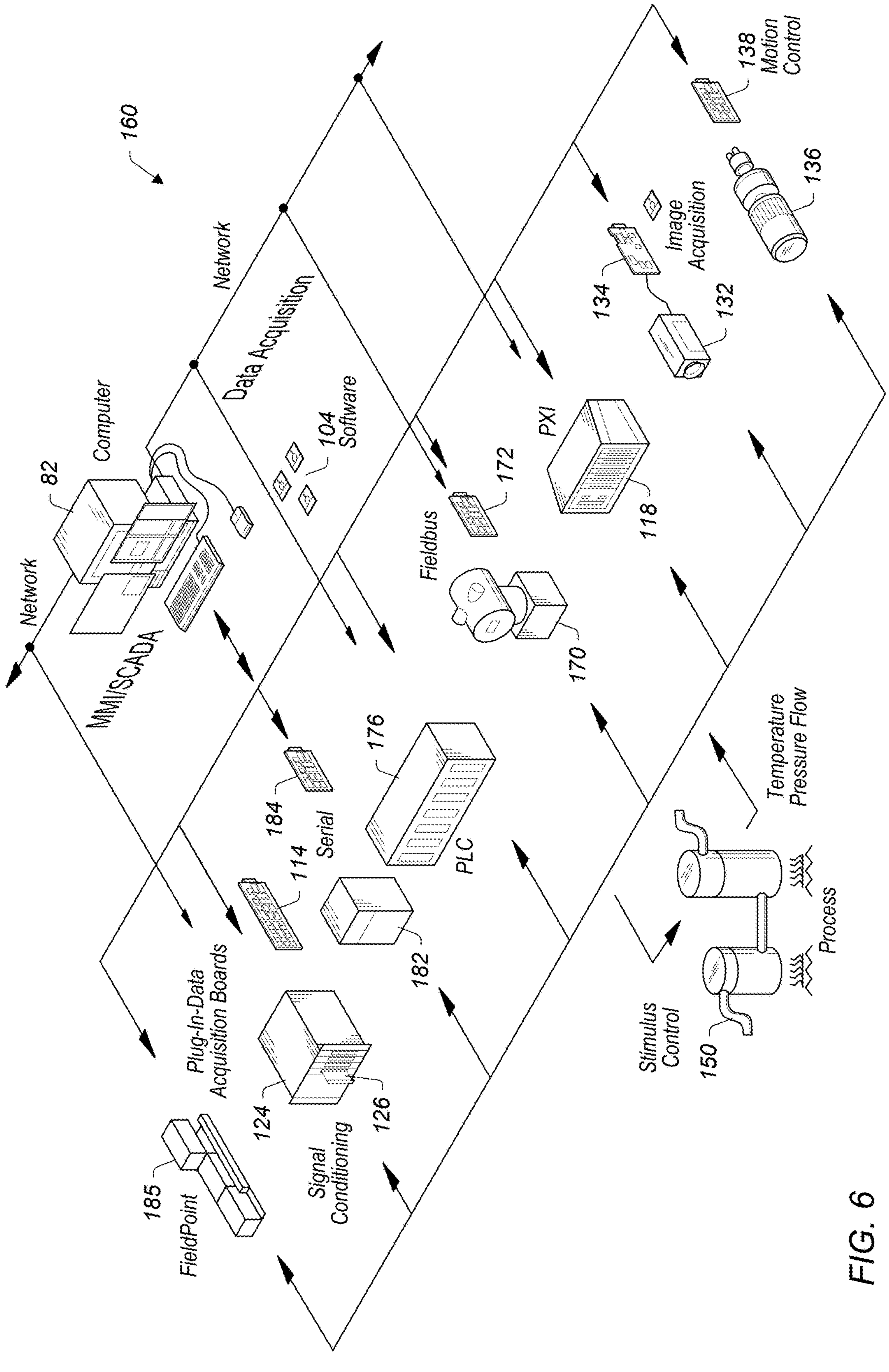
FIG. 6 shows an example industrial automation system with instruments networked together according to one set of embodiments.

FIG. 6 illustrates an exemplary industrial automation system 160 that may be configured according to embodiments of the present invention. Industrial automation system 160 may be similar to instrumentation or test and measurement system 100 shown in FIG. 5. Elements that are similar or identical to elements in FIG. 5 have the same reference numerals for convenience. System 160 may comprise a computer 82 which may couple to one or more devices and/or instruments which may use one or more probe ICs for performing measurements and tests. Computer 82 may comprise a CPU, a display screen, memory, and one or more input devices such as a mouse or keyboard as shown. Computer 82 may operate with the one or more devices and/or instruments to perform an automation function, such as MMI (Man Machine Interface), SCADA (Supervisory Control and Data Acquisition), portable or distributed data acquisition, process control, and advanced analysis, among others, on process or device 150.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a field bus device 170 and associated field bus interface card 172, a PLC (Programmable Logic Controller) 176, a serial instrument 182 and associated serial interface card 184, or a distributed data acquisition system, such as the Compact FieldPoint or CompactRIO systems available from National Instruments, among other types of devices. In some embodiments, similar to the system shown in FIG. 5, the computer system may couple to one or more of the instruments/devices via a network connection, such as an Ethernet connection, which may facilitate running a high-level synchronization protocol between the computer system and the coupled instruments/devices.

In addition to the above, the following features may be added to or implemented in any of the various different versions of probe ICs disclosed herein:

Ability to pass a stimulus signal through the same signal path to a device under test being tested via the probe IC, Pulser for de-embedding, Ability to query the DUT to determine the type of the DUT, Ability to store calibration parameters, Ability for performing trimming of the probe IC on the test fixture (e.g., on the printed circuit board.)

In some embodiments, any one or more of the instruments and/or the various connectivity interfaces of computer 82 (coupling computer 82 to the one or more devices) may be implemented such that power is delivered to a probe (used to connect to any one or more of the instruments and/or connectivity interfaces of computer 82) over the same connection also that carries the signal back to the instrument when using a probe IC 200 as shown in FIG. 2. Generally, various embodiments disclosed herein facilitate an instrument, for example an instrument configured in an automated test system, to be used with probe ICs configured on test fixtures, for example on printed circuit boards.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

I claim:

1. A probe integrated circuit (IC) comprising:

an input port;

a ground port;

a buffer amplifier;

a compensated voltage divider coupling an input of the buffer amplifier and the input port to the ground port; and an output port coupled to an output of the buffer amplifier and configured to couple to a measurement instrument, wherein the output port is configured to operate as a probe signal output and a probe power input, wherein the buffer amplifier is configured to receive power via the output port operating as the probe power input.

2. The probe IC of claim 1, further comprising:

a power port configured to receive a supply voltage and provide the supply voltage to a power supply port of the buffer amplifier.

3. The probe IC of claim 2, further comprising:

a decoupling capacitor coupling the power supply port of the buffer amplifier to a reference ground voltage.

4. The probe IC of claim 3, wherein a value of the decoupling capacitor is less than 1000 picofarads.

5. The probe IC of claim 1, wherein the compensated voltage divider is configured to be factory trimmable and resistant to overvoltage events.

6. The probe IC of claim 1, wherein the output port comprises a buffered output.

7. The probe IC of claim 6, wherein the buffered output is configured to drive a 50 Ohm controlled impedance line.

8. The probe IC of claim 1, further comprising:

digital logic circuitry coupling the ground port to the compensated voltage divider and the output port.

9. The probe IC of claim 1, further comprising:

an interface for controlling a configuration of the probe IC.

10. The probe IC of claim 1, wherein the measurement instrument comprises an oscilloscope.

11. The probe IC of claim 1, further comprising:

customized software to control one or both of the probe IC and the measurement instrument.

12. A test fixture, comprising:

a measurement instrument; and a mounted probe integrated circuit (IC) comprising:

an input port;

a ground port;

a buffer amplifier;

a compensated voltage divider coupling an input of the buffer amplifier and the input port to the ground port; and an output port coupled to an output of the buffer amplifier and configured to couple to the measurement instrument, wherein the output port is configured to operate as a probe signal output and a probe power input, wherein the buffer amplifier is configured to receive power via the output port operating as the probe power input.

13. The test fixture of claim 12, wherein the measurement instrument is configured to receive probe signals from the mounted probe IC.

14. The test fixture of claim 12, wherein the measurement instrument comprises an oscilloscope.

15. The test fixture of claim 12, wherein the mounted probe IC comprises customized software to control one or both of the mounted probe IC and the measurement instrument.

16. The test fixture of claim 12, wherein the mounted probe IC further comprises an interface for controlling a configuration of the mounted probe IC.

17. The test fixture of claim 12, wherein the mounted probe IC further comprises:

a power port configured to receive a supply voltage and provide the supply voltage to a power supply port of the buffer amplifier; and a decoupling capacitor coupling the power supply port of the buffer amplifier to a reference ground voltage, wherein a value of the decoupling capacitor is less than 1000 picofarads.

18. The test fixture of claim 12, wherein the compensated voltage divider is configured to be factory trimmable and resistant to overvoltage events.

19. The test fixture of claim 12, wherein the output port comprises a buffered output, and wherein the buffered output is configured to drive a 50 Ohm controlled impedance line.

20. The test fixture of claim 12, wherein the mounted probe IC further comprises:

digital logic circuitry coupling the ground port to the compensated voltage divider and the output port.

* * * * *